United States Patent [19]
Morris

[11] Patent Number: 5,708,400
[45] Date of Patent: Jan. 13, 1998

[54] AC COUPLED TERMINATION OF A PRINTED CIRCUIT BOARD POWER PLANE IN ITS CHARACTERISTIC IMPEDANCE

[75] Inventor: Terrel L. Morris, Garland, Tex.

[73] Assignee: Hewlett-Packard Company, Palo Alto, Calif.

[21] Appl. No.: 739,532

[22] Filed: Oct. 30, 1996

[51] Int. Cl.⁶ ........................................ H05K 9/00
[52] U.S. Cl. .................. 333/12; 174/35 R; 361/818; 333/22 R
[58] Field of Search ....................... 333/12, 22 R, 333/125, 248; 361/763, 766, 794, 818; 174/35 R, 35 MS

[56] References Cited

U.S. PATENT DOCUMENTS

| | | | |
|---|---|---|---|
| 3,992,686 | 11/1976 | Canning | 333/12 X |
| 5,165,055 | 11/1992 | Metsler | 333/12 |
| 5,351,018 | 9/1994 | Lehmann et al. | 333/12 |
| 5,586,011 | 12/1996 | Alexander | 361/818 |

*Primary Examiner*—Paul Gensler
*Attorney, Agent, or Firm*—Edward L. Miller

[57] ABSTRACT

High speed power supply transients are suppressed in a system having fast edges and where a radial transmission line exists between the power supply and ground planes, by terminating the edges of the PCB in it characteristic impedance. In practice, this means approximating a continuous construct with many spaced instances of a discrete resistance. The dissipative terminations themselves are resistive, and if placed directly between the power supply and ground would needlessly dissipate a great deal of DC power. To prevent that they are AC coupled with a high quality coupling capacitor of sufficient capacitance to allow the resulting impedance to appear predominately resistive at and above the lowest frequency of interest, say, 100 MHz. Because of the confused nature of the reflection that may be generated at arbitrary locations within the interior of the PCB, there may well be "hot spots" within that interior that would benefit from the placement of a selected AC coupled load at or near such a spot.

5 Claims, 2 Drawing Sheets

AC COUPLED TERMINATION OF A PRINTED CIRCUIT BOARD POWER PLANE IN ITS CHARACTERISTIC IMPEDANCE

BACKGROUND OF THE INVENTION

The extensive logic circuits found in very large scale integration (VLSI) application specific integrated circuits (ASIC's) often require a large number of interconnections between such VLSI ASIC's. Multi-layer printed circuit boards (PCB's) are a natural choice when a product is to contain VLSI circuitry. Multi-layer PCB's have different portions of the needed interconnections on each layer. Some of these layers are dedicated to power supply distribution, and some to ground (power supply return). And whereas a layer used primarily for signal interconnection will have most of its metal removed to create traces, layers for power distribution (power supply, or P/S) and for power return (ground) are usually left in sheet form, with as much metal remaining in place as possible. The term "plane" is often used in reference to the various layers of a multi-layer PCB, and it seems especially appropriate to do so for power supply and ground layers.

It is common to have multiple ground planes at different places in a multi-layer PCB. This is frequently done for shielding. It is also common to let a power supply plane and a ground plane be adjacent layers. The motivation for this is that there can be significant capacitive coupling between adjacent planes, which, in the case of adjacent (and largely unetched) power supply and ground planes, is thought to contribute to power supply by-passing. Perhaps so, but they also form a radial transmission line. That is, they form a transmission line that propagates energy within a plane but without a preferred single path defined between an input and an output, propagating instead, for a feed point within the plane, in all radial directions outward from the feed point and within the plane. Radial transmission lines are known in the art. See, for example, *FIELDS and WAVES in MODERN RADIO*, 2nd ed., 1963, by Simon Ramo and John R. Whinnery (John Wiley & Sons), pp 395–405.

State of the art logic circuits often operate at very high speeds with very fast edges. Short term (in the nanosecond range) AC currents in the power supply and ground planes have been measured to have levels of five to fifteen amperes. Under these circumstances, an adjacent power supply/ground plane pair is not so much a capacitor as it is a radial transmission line. Indeed, both by actual measurement and by theoretical methods, one common fabrication regime involving 0.004" thick glass epoxy laminate (FR4) produces a characteristic impedance of about 4.5Ω for adjacent planes having little or no metal removed.

At this point a number of observations are in order. First, the presence or existence of these switching transients is well understood. They manifest themselves as short term disturbances, or glitches, in the power supply voltage. Often times, one would say that "the supplies are noisy", or that "the ground is not solid". Next, such "noise" is not always harmless. A large scale collection of associated circuits, such as a high speed computer, or worse yet, a very high speed mini-super computer, may not be a "high precision" mechanism in the same sense that parts of an eight digit voltmeter are, but it certainly qualifies as "medium precision", especially when it is remembered that it is a truly complicated system whose cooperating elements are sometimes several feet apart. Thus, power supply transients that, say, introduce skew in a clock driver, can become a very serious issue.

The first line of defense against power supply transients is filtering, bypassing and decoupling. It is not that these strategies do not work: they do, although less so as edges get faster in an environment where the power supply and ground planes form a transmission line. Filtering, bypassing and decoupling are essentially instances of short term energy storage that work best when practiced close to a culprit (source of noise) and to a victim (circuit susceptible to noise). They are best used in places where the real issue is short term regulation: "This circuit turns on and the supply sags. If I put a capacitor here it will help supply current and reduce the sag." It is common to scatter bypass capacitors liberally throughout the physical layout of a PCB. In addition to being a source of charge to reduce power supply sag, an additional special virtue of a bypass is its low AC impedance for the high frequency components of a signal. The idea is to reduce or eliminate the need for high frequency currents to circulate long distances through inductive supply and return paths. The lower the impedance, the better the bypass. And while this helps some, it by no means eliminates the problem. In fact, when the rise and fall times get short enough, bypassing can become part of the problem.

The reason that bypassing can become part of the problem is revealed when it is appreciated that the transient is not solely a steady state (think DC) event. The fact that some culprit circuit's current drain on the supply has suddenly changed might account for an initial change in power supply voltage at a power supply pin of that IC. At this point it would be appropriate to invoke a voltage divider analogy composed of a source resistance and a changing load resistance. So far, so good. But it must also be remembered that today's logic circuits have sub-nanosecond rise and fall times, and that a big 'ol electrolytic capacitor over in the corner of the board just won't work anymore, like it did when rise and fall times were in the microseconds. A steady state analysis won't do anymore, either. Even though we might use a shift in steady state operating point to explain the creation of a disturbance, once it happens we are then better off to think of the culprit as a generator coupling a signal into a transmission line. If a high quality bypass could be located right at the culprit, it might be effective. But that point is probably a power supply pin(s) in the middle of a large array of pins for a huge ASIC (with 700 to 1000 pins). The nearest practical physical location for a bypass may be some inches away. The power supply pin is a source (generator) coupling AC energy in all directions (say, east, west, north and south, and all directions inbetween) into a radial transmission line formed by the power supply and ground planes. And here is the nearest practical bypass: over to the west, say. Not only does that bypass not have an effect on what propagated in a non-west direction, that bypass is very likely a discontinuity in the transmission line, and merely reflects the disturbance reaching it, instead of attenuating it. As is well known, reflected electromagnetic energy can exhibit a voltage doubling effect. If this voltage doubling occurs at a location where a victim circuit draws its power, the result can be even worse than before.

The effects of propagating and reflecting transient electromagnetic energy in a radial transmission line distributing DC power can be measured. In one system where $V_{cc}$ is +3.3V, an initial disturbance peaking at $V_{cc}$−200 mv after 2 nsec was observed to abruptly change polarity and increase in amplitude +400 mv in less than 2 nsec to $V_{cc}$+200 mv, with a ringing decay back to $V_{cc}$ in about 10 nsec. In a 3.3V system a 400 mv peak to peak excursion in under 2 nsec is potentially very bad news, indeed.

Reflections are everywhere in the radial transmission line formed by the power and ground planes. A closely spaced collection of vias can create a reflection. A short circuit (think: a good bypass) creates a reflection. An open circuit creates a reflection. Open circuits occur at the edges of the PCB, and sometime in the middle if there is a break in one of the planes or a hole in the PCB (say, to provide clearance for some heat sink, or a fan motor, etc. Decoupling might help a victim circuit it is intended to protect, but at the expense of creating another discontinuity. Decoupling might help isolate a culprit, but only if it can be physically deployed exactly where it is needed, which would be unusual. However, it also creates a discontinuity that furthers the generation and scattering of reflections for disturbances approaching it from elsewhere and that are already within the transmission line. Random reflections that encounter one another add by vector addition. This means that from time to time there may be some really nasty transients that do their damage and then vanish, never to be measured.

So, the regular strategies of filtering, bypassing and decoupling do not work to suppress power supply transients in a system having high speed logic and where a radial transmission line exists between the power supply and ground planes. In fact, they can actually make the situation worse. What to do?

SUMMARY OF THE INVENTION

A solution to the problem of suppressing power supply transients in a system having fast edges and where a radial transmission line exists between the power supply and ground planes, is to recognize that the transients are not merely variations in a voltage versus time relationship, but are propagating electromagnetic energy. Energy cannot be averaged away, but it can be dissipated, or absorbed; that is, turned into heat. This may be done by terminating the edges of the PCB in its characteristic impedance. In practice, this means approximating a continuous construct with many spaced instances of a discrete resistance. Thus, in one actual instance for a multi-layer PCB approximately nine by eighteen inches in size, termination assemblies were placed at the periphery of the PCB at intervals of about one to two inches. The dissipative terminations themselves are resistive, and if placed directly between the power supply and ground would needlessly dissipate a great deal of DC power. The solution is to AC couple them with a high quality coupling capacitor of sufficient capacitance to allow the resulting impedance to appear predominately resistive at and above the lowest frequency of interest, say, 100 MHz. Because of the confused nature of the reflection that may be generated at arbitrary locations within the interior of the PCB, there may well be "hot spots" within that interior that would benefit the placement of a selected AC coupled termination at or near such a location.

DESCRIPTION OF A PREFERRED EMBODIMENT

Figure 1:
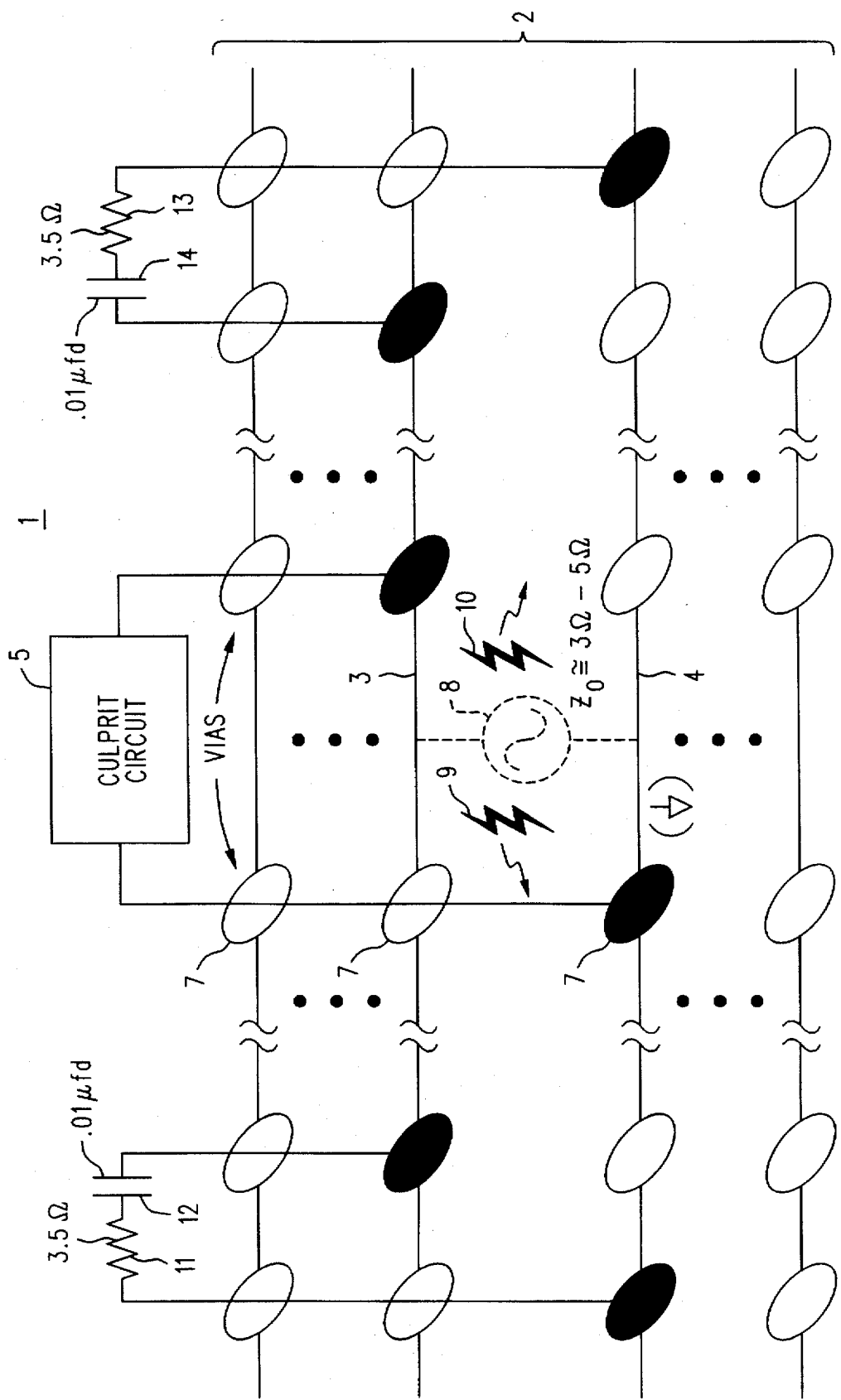
FIG. 1 is a simplified schematic representation of the radial transmission line formed by adjacent power and ground planes in a multi-layer printed circuit board, of how high speed disturbances in power supply voltage may drive that transmission line, and of a plurality of discrete AC coupled terminations disposed about the periphery of the printed circuit board.

Refer now to FIG. 1, wherein is shown a simplified schematic representation 1 of the electrical situation associated with a multi-layer printed circuit board 2 having a power supply ($V_{cc}$) plane 3 adjacent to a ground plane 4. A "culprit circuit" 5 is connected to the power supply plane 3 by a via ("popthru") 6 and to the ground plane 4 (power supply return) by a via 7. (We have shown these as single vias each. In reality the connections to each of power and ground are probably accomplished by large numbers of vias.) As part of its normal operation culprit circuit 5 creates fast transient currents in vias 6 and 7, say, di/dt in excess of an ampere per nanosecond. This effectively creates an RF generator 8 that couples energy (9 & 10) in all directions into a radial transmission line formed by the power supply plane 3 and the ground plane 4. It will be appreciated that although we show two oppositely directed energies 9 and 10, energy actually propagates in all directions; i.e., radially outward from the generator 8 and within the plane of the board. (Recall the familiar "thrown rock/ripples in a pond" analogy.) As such energy propagates it is accompanied by a voltage wave which, as it passes other "victim" circuits (not shown), appears to them as a transient in their applied power supply voltage.

A portion of radiating energy 9 and 10 is reflected by any discontinuity in the radial transmission line. It is typical for the characteristic impedance $Z_0$ of the radial transmission line to have a fairly low value, say in the range of from 3Ω to 5Ω. These values depend, of course, in a known way upon the dielectric constant of the material between the conductors in the power supply plane 3 and ground plane 4, as well upon the spacing therebetween. What is of special interest in this regard is that a really good bypass (low $X_C$ and low $X_L$) appears as a short circuit discontinuity at a point in the radial transmission line, and that the edge of the multi-layer PCB appears as an open circuit discontinuity. A region densely populated with vias (as under a large ASIC) appears as a discontinuity, also. A discontinuity reflects propagating energy according to the extent it represents a mis-match with the characteristic impedance of the transmission line. Of these, the edges of the board cause the greatest amount of reflection, since an edge is an altogether abrupt and total (open circuit) discontinuity, and since the edge encircles the board.

Reflected energy is accompanied by phase reversals in its components, and total reflections from the open circuit at the edge of the board can cause a phenomenon known as "voltage doubling". This phenomenon arises in the same manner as the familiar VSWR often used in characterizing transmission line systems. The term "voltage doubling" will be understood to mean not merely a transient increase by 100% of the propagating transient (to 200% ), but also a possible transient decrease of nearly 100% (to near 0%). (The "100%" mentioned here is a value that is realizable in laboratory set-ups, with coax or waveguide. The radial transmission line environment of interest here is potentially more complicated in practice, although not in principle. Remember also that the "100%" is related to the propagating transient excursion (deviation from DC), not to the DC value of the power supply voltage.)

In a conventional printed circuit board the voltage doubling effect is most noticeable near the edges of the board. It can also be a significant effect at an interior location of a board, especially a large one, depending on the particular way reflections and re-reflections combine. Even if the edges of the board are terminated as described herein, it may nevertheless be desirable to add an AC coupled termination at selected locations within the interior of the board. These locations and the value of the resistance would be found by experimental methods, and some care may be needed to asses that the benefit is real. The need for caution arises since the act of putting a genuine termination into an interior portion of a transmission line is itself a discontinuity. It is likely that this sort of action is better thought of as putting a selected load at a selected location to ameliorate some particular problem.

Reflections occur in a transmission line only when there is a discontinuity. If the edge of the board is terminated in the characteristic impedance of the radial transmission line, then there will be no reflections from the edge. This will not eliminate the initial transient, to be sure. It does, however, prevent it from being compounded by reflection from the edge, which is a major improvement. In FIG. 1 one edge of the printed circuit board 2 is terminated (at one of many locations) by resistor 11 in series with DC blocking capacitor 12, which series combination is but one of many such AC terminations along that edge of the board. On another side of the board 2 is yet another AC termination composed of resistor 13 and capacitor 14. It is also but one of many. Resistors 11 and 13, and capacitors 12 and 14, are preferably surface mount components. The electrical value of the resistors is chosen to maximize the degree of match of the series RC combination to the radial transmission line. The capacitors are selected to have as large a capacitance as possible, consistent with exhibiting a low residual inductance at high frequencies.

Figure 2:
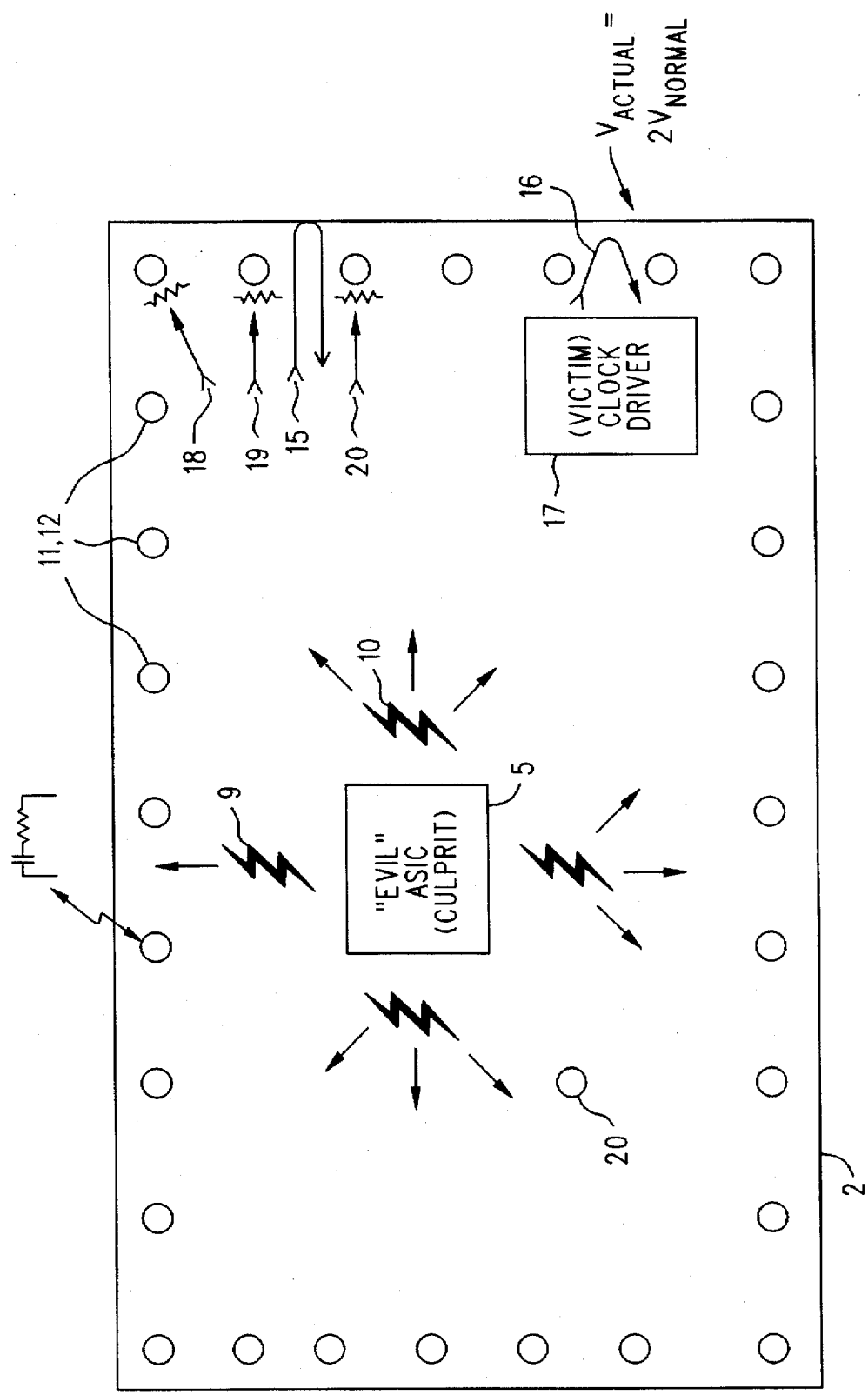
FIG. 2 is a simplified pictorial diagram of a multi-layer printed circuit board illustrating the nature of propagating transient energy away from a culprit circuit, some of which may be toward a victim circuit, and indicating the effects of the presence and absence of AC terminations around the periphery of the board.

Refer now to FIG. 2, which is a top (or perhaps bottom) view of a multi-layer printed circuit board 2 having a plurality of AC coupled terminations (11, 12) disposed along it edges. As before, a culprit circuit 5 (an "evil" ASIC) causes transient energy (9, 10) to propagate in all directions within the radial transmission line created by the power supply and ground planes.

First consider the case when there are no terminations. Arrows 15 and 16 represent propagating transient energies that reach the edge of the board 2 and are reflected. A victim circuit 17 (say, a clock driver circuit) is located in close vicinity to reflection 16. It is then a prime candidate for experiencing the voltage doubling effect, as indicated by the legend $V_{ACTUAL}=2V_{NORMAL}$ (i.e., that the combined applied and reflected voltage $V_{ACTUAL}$ at that location is twice the otherwise normal applied transient voltage $V_{NORMAL}$).

Now note the AC coupled terminations (11, 12), indicated in the diagram by the small circles. They absorb the propagating transients, preventing reflections from the edges of the board 2. This is indicated by arrows 18, 19 and 20. Note that it may be desirable to dispose an AC coupled termination (or load) 20 at a location within the interior of the board 2.

As mentioned earlier, AC coupled terminations (11, 12) are located about every one to two inches along the edge of the board. If they are located somewhat further apart or somewhat closer together (say, by factors of two and one half, respectively), they would still have the same resistive and capacitive values. This may be appreciated by noting that whatever energy is absorbed by a termination never "sees" an adjacent termination. Hence, insofar as they absorb incident energy, the adjacent terminations are not in parallel, as they would be in a DC analysis. This is good news, since it means that we can locate as many adjacent terminations as close together as needed to achieve a reasonable level of effectiveness.

Provided that the terminations are "close enough" as described below, it will be understood that for frequency components below some associated frequency there is no discernable difference between the collection of discrete (lumped constants) AC coupled terminations and a distributed (continuous) one. That is, provided the terminations absorbing the energy represented by arrows 19 and 20 are "close enough", then the U-shaped arrow 15 vanishes (as does arrow 16); its energy will be absorbed by the two adjacent terminations.

We turn now to a simplified and abbreviated discussion of how close together is "close enough" for adjacent AC coupled terminations. Our aim here is to give the flavor of the underlying reasons without becoming needlessly complicated. We begin with some observations. The highest frequency of interest is determined by the fastest rise time (or fall time) for a culprit circuit. We are not particularly concerned with the repetition rate of that edge. The transition time of the fastest edge is decomposable into harmonic components of higher and higher frequencies, with each component of higher frequency containing less energy than those below it. Referring again briefly to FIG. 1, the generator 8 may be construed as producing all those components, up to some limit where there is no longer enough energy to be of concern, no matter how it may be reflected. That highest effective frequency of concern might be, say, the fifth harmonic of the fundamental frequency corresponding to the rise time. For the sake of example and recognizable numbers, let's assume that the fastest rise time is one nanosecond. That says we are concerned with frequencies up to 5 GHz. Transmissions lines built of FR4 have a velocity of electromagnetic propagation significantly less than c, the speed of light in vacuo. In particular, that velocity is, depending upon vendor and batch, somewhere in the range of 174 to 196 picoseconds per inch. A value of 182 picoseconds per inch was observed for one multi-layer board of interest, and will be the value assumed here. The period of 5 GHz is one fifth of a nanosecond, which is one fifth of a thousand picoseconds, or two hundred picoseconds. Accordingly, the wavelength in FR4 of 5 GHz is very nearly 1.1 inches.

Now for the tricky part. Just as with other wave phenomena, the effective width of a termination is related to the wavelength of the signal it is to absorb. The bending of light around a sharp edge, the bending of light as it passes from one medium to another (Snell's law) and the separation of light into its components by a slit all come to mind. We have a similar situation here. The effective width of the termination is not simply the cross section of the vias that connect it to the radial transmission line. It is wider than that, with the understanding that the further away you go from those vias the more reflection occurs. The distance that must be moved away from a termination is comparable to a wavelength. But as you move away from one termination you begin to approach the one that is adjacent to it. So, if the terminations are a wavelength apart you never get to be even an effective half wavelength away from any termination before starting to get closer to an adjacent termination. (The midpoint is half way from both terminations, not from just one. This is much less severe than being a half wavelength away from a solitary termination, since both terminations will absorb some energy.) So, for frequencies up to 5 GHz in FR4, AC coupled terminations spaced one to two inches apart is a good first order approximation of a continuous termination.

Lastly, we will note that it would certainly be possible to fabricate a continuous (distributed) termination around the edge of the board. There are sheet resistive materials, such as Ohmega ply from Ohmega Technologies, Inc., Culver City, Calif., that would be suitable for use as the resistive part of the load. The challenge is the coupling capacitor. One could leave it as a collection of discrete parts, which would nullify the advantage sought. The preferred solution would be to build a continuous (distributed) capacitor in as part of the board, perhaps using corresponding regions of material of increased dielectric constant. One such material is Zycon from Hadco Corp., Salem, N.H. The use of very thin dielectrics may be helpful, too. The cross sectional geometry of any such continuous solution is probably of considerable interest, since operation with extremely high frequency components is probably what would motivate such an exercise, and any residual lumped reactances would be detrimental. If the symbol T represents surfaces of a radial transmission line, R a terminating resistance and C a DC block, then a desirable cross section would be denoted thus:

```
TTTTTTTTTTT
     C
     R
TTTTTTTTTTT
``` or

```
TTTTTTTTTTC
TTTTTTTTTTR
```

Anything that resembled the following would be suspect. The symbol L represents an "exposed" inductance present in what would otherwise be a T, but is not coextensive with the other side of the radial transmission line (and hence is no longer part of a transmission line!).

```
TTTTTTTTLLLLLLR
              R
TTTTTTTTCCCCRRR
``` or

```
TTTTTTTTLLLLLLC
              C
TTTTTTTTRRRRRRC
```

I claim:

1. A method of reducing the amount of transient electromagnetic energy propagating in a radial transmission line formed by power supply and ground planes in a multi-layer printed circuit board, the method comprising the steps of disposing a plurality of discrete AC coupled resistive terminations at intervals around the periphery of the printed circuit board, the resistive component of the AC coupled termination approximating the characteristic impedance of the radial transmission line.

2. A method of reducing the amount of transient electromagnetic energy propagating in a radial transmission line formed by power supply and ground planes in a multi-layer printed circuit board having plurality of edges, the method comprising the steps of disposing a distributed AC coupled resistive termination along each edge of the printed circuit board, the resistive component of each distributed AC coupled termination matching at least approximately the characteristic impedance of radial transmission line.

3. A multi-layer printed circuit board assembly comprising:

a multi-layer printed circuit board having a power supply plane and a ground plane adjacent to the power supply plane; and a plurality of series resistance capacitance circuits coupled at one end to the power supply plane and at the other to the ground plane, the circuits of the plurality disposed at intervals along the periphery of the printed circuit board; the resistance component of the circuit approximating the characteristic impedance of a radial transmission line formed by the power supply and ground planes.

4. A multi-layer printed circuit-board as in claim 3 wherein the intervals are approximately one to two inches.

5. A multi-layer printed circuit board assembly comprising:

a multi-layer printed circuit board having a power supply plane and a ground plane adjacent to the power supply plane;

a distributed AC coupled termination disposed along an edge of the multi-layer printed circuit board; and the resistance of the distributed AC coupled termination approximately matching the characteristic impedance of the radial transmission line formed by the power supply and ground planes.

* * * * *